(12) United States Patent
Leobandung

(10) Patent No.: US 10,325,852 B2
(45) Date of Patent: Jun. 18, 2019

(54) SELF-ALIGNED VERTICAL TRANSISTOR WITH LOCAL INTERCONNECT

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/894,482

(22) Filed: Feb. 12, 2018

(65) Prior Publication Data

US 2018/0174969 A1    Jun. 21, 2018

Related U.S. Application Data

(62) Division of application No. 15/172,870, filed on Jun. 3, 2016, now Pat. No. 9,917,059.

(51) Int. Cl.
| H01L 21/84 | (2006.01) |
| H01L 27/12 | (2006.01) |
| H01L 23/535 | (2006.01) |
| H01L 27/088 | (2006.01) |
| H01L 29/423 | (2006.01) |
| H01L 29/786 | (2006.01) |
| H01L 21/8234 | (2006.01) |

(52) U.S. Cl.
CPC .... *H01L 23/535* (2013.01); *H01L 21/823418* (2013.01); *H01L 21/823437* (2013.01); *H01L 21/823475* (2013.01); *H01L 21/823487* (2013.01); *H01L 21/84* (2013.01); *H01L 27/088* (2013.01); *H01L 27/1203* (2013.01); *H01L 29/42392* (2013.01); *H01L 29/78642* (2013.01)

(58) Field of Classification Search
None
See application file for complete search history.

(56) References Cited

U.S. PATENT DOCUMENTS 9,368,572 B1    6/2016    Cheng

OTHER PUBLICATIONS

List of IBM Patents or Patent Applications Treated as Related, dated Feb. 12, 2018, 2 pages.

*Primary Examiner* — Whitney Moore
(74) *Attorney, Agent, or Firm* — Scully, Scott, Murphy & Presser, P.C.; L. Jeffrey Kelly, Esq.

(57) ABSTRACT

A metallization scheme for vertical field effect transistors (FETs) is provided. By forming lower-level local interconnects connecting source regions located at bottom portions of semiconductor fins, and upper-level interconnects connecting adjacent metal gates located along sidewalls of channel regions of the semiconductor fins, electrical connections to the source regions and the metal gates can be provided through the lower-level local interconnects and the upper-level local interconnects, respectively. As a result, gate, source and drain contact structures are formed on the same side of vertical FETs.

20 Claims, 16 Drawing Sheets

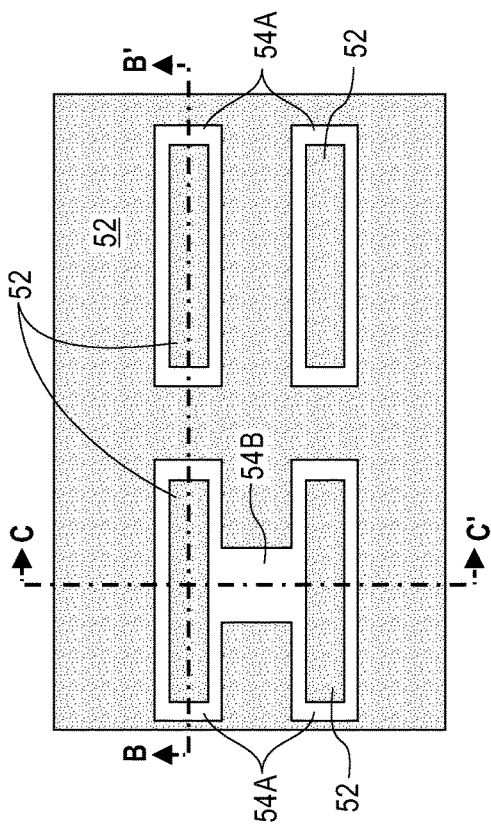
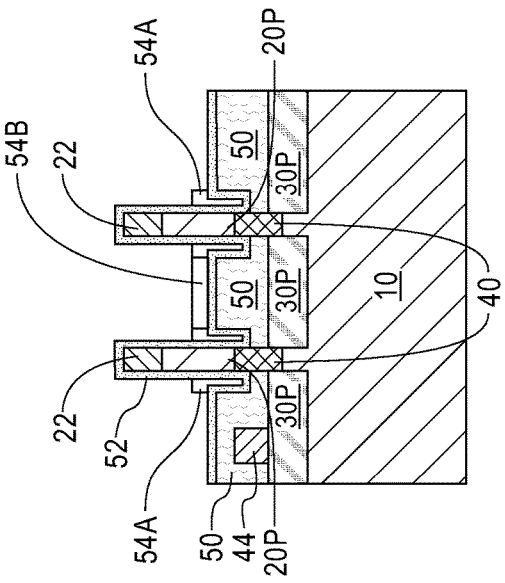
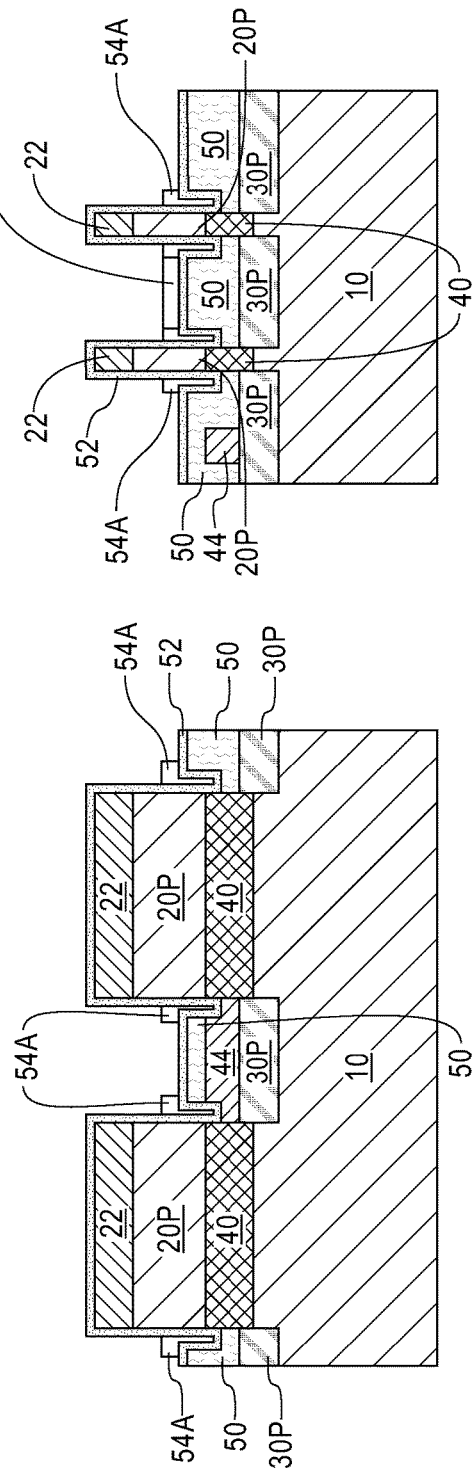

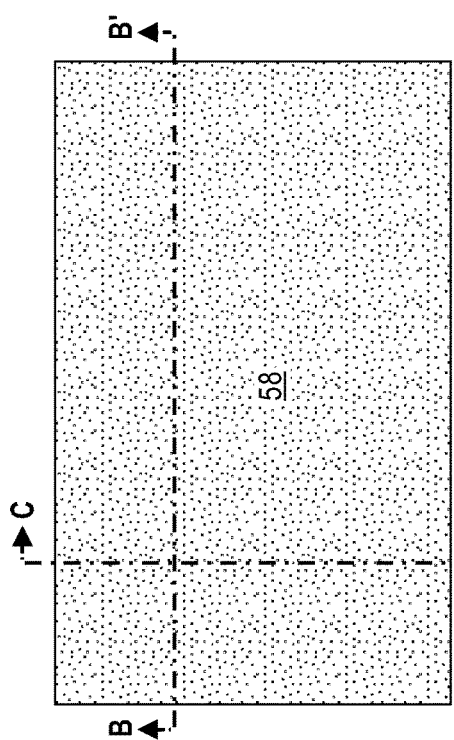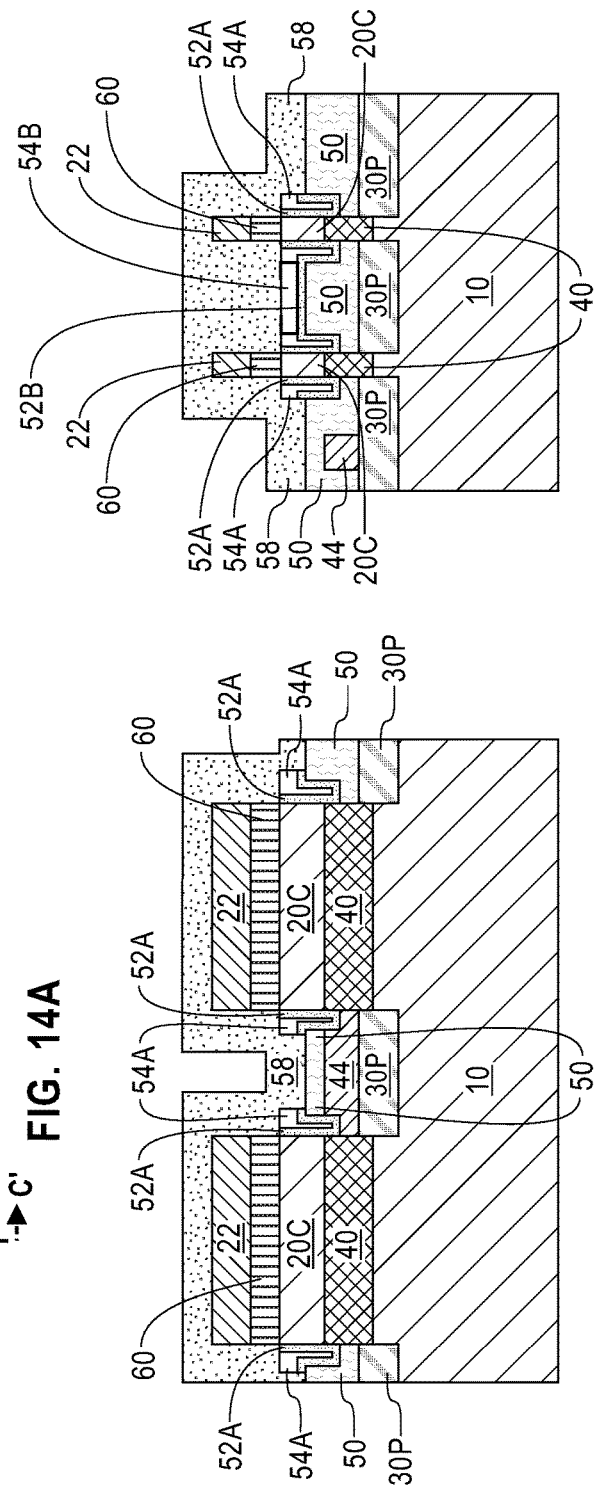
FIG. 14A
FIG. 14B
FIG. 14C

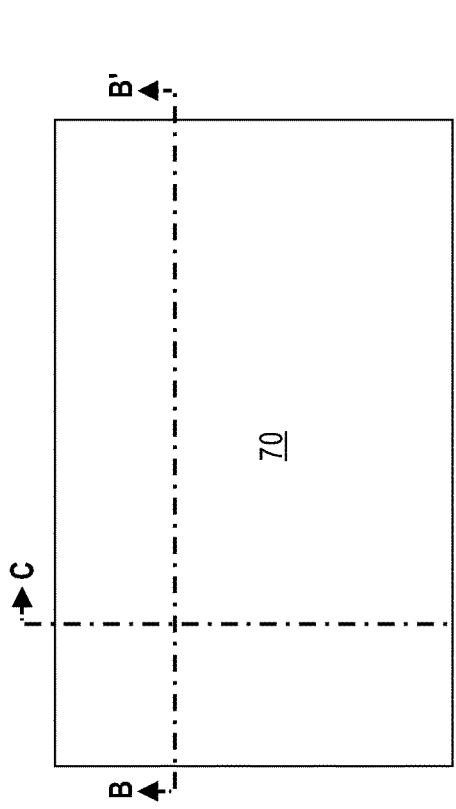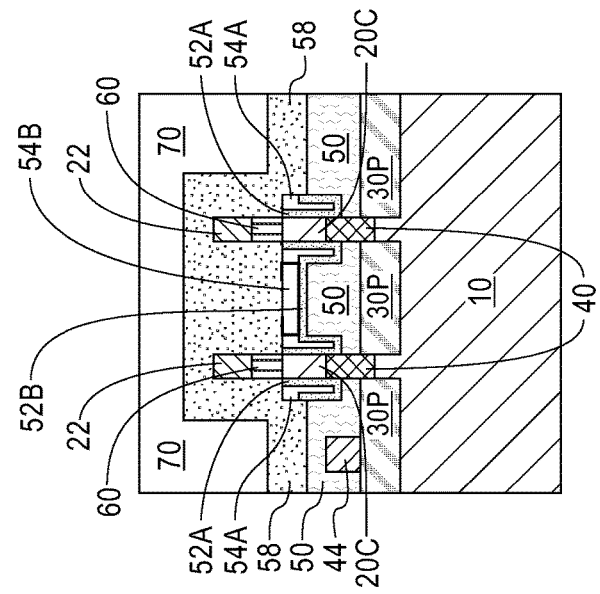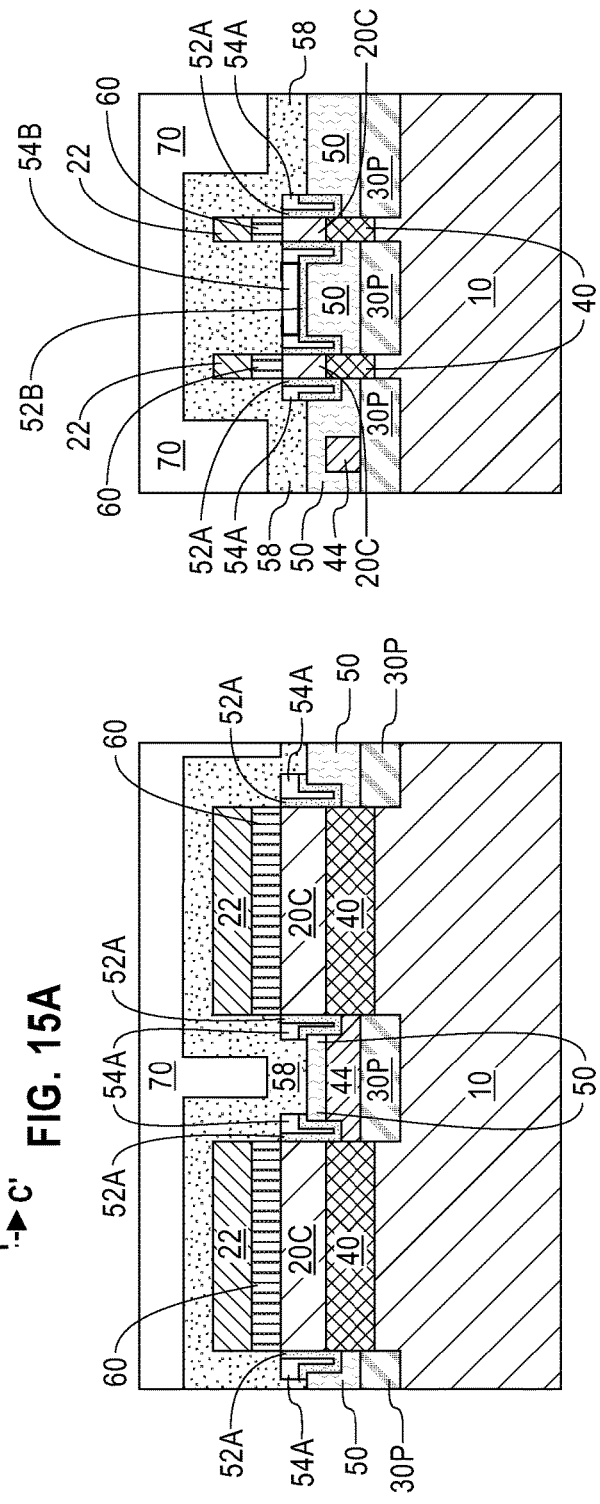

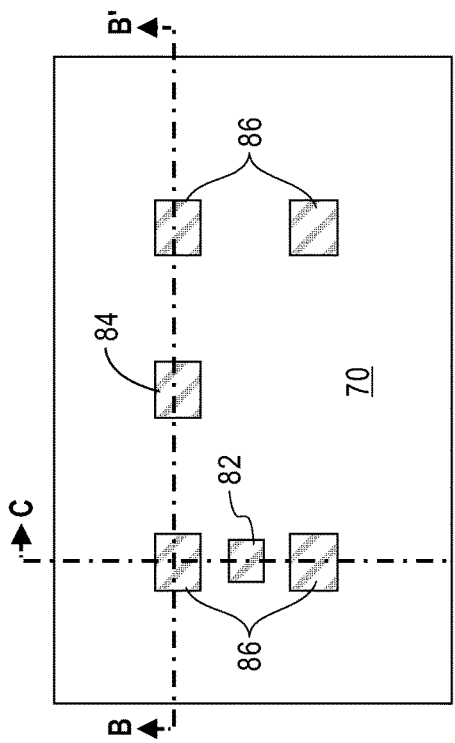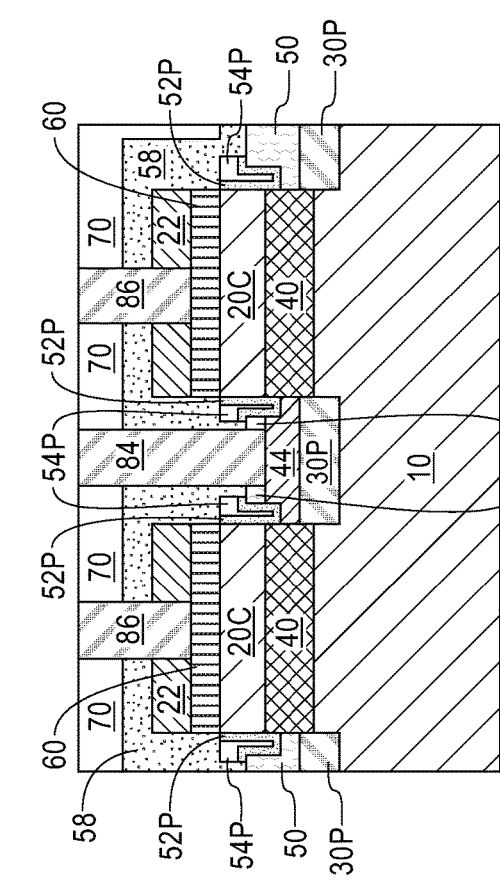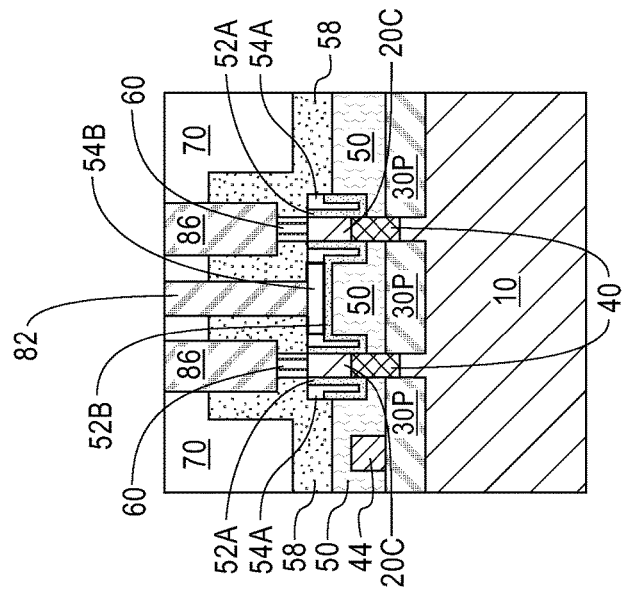

_US 10,325,852 B2_

SELF-ALIGNED VERTICAL TRANSISTOR WITH LOCAL INTERCONNECT

BACKGROUND

The present application relates to semiconductor device fabrication, and more particularly, to the metallization of vertical field effect transistors (FETs).

A vertical field effect transistor (FET) has a channel oriented perpendicular to the substrate surface, as opposed to being situated along the plane of the surface of the substrate in the case of a lateral FET. By using a vertical design, it is possible to increase packing density. That is, by having the channel perpendicular to the substrate, vertical FETs improve the scaling limit beyond lateral FETs. However, vertical device architecture makes metallization of vertical FETs very difficult.

SUMMARY

The present application provides a metallization scheme for vertical FETs. By forming lower-level local interconnects connecting source regions located at bottom portions of semiconductor fins, and upper-level interconnects connecting adjacent metal gates located along sidewalls of channel regions of the semiconductor fins, electrical connections to the source regions and the metal gates can be provided through the lower-level local interconnects and the upper-level local interconnects, respectively. As a result, gate, source and drain contact structures are formed on the same side of vertical FETs.

According to an aspect of the present application, a semiconductor structure is provided. The semiconductor structure includes a plurality of vertical fin field effect transistors (FinFETs), each of the plurality of vertical FinFETs includes a source region located at a bottom portion of a semiconductor fin, a drain region located at a top portion of the semiconductor fin, a channel region located between the source region and the drain region, and a metal gate located along sidewalls of the channel region. The semiconductor structure further includes lower-level local interconnects electrically connecting the source regions and upper-level local interconnects electrically connecting the metal gates. Each of the lower-level local interconnects contacts sidewalls of adjacent source regions. Each of the upper-level local interconnects contact sidewalls of adjacent metal gates.

According to another aspect of the present application, a method of forming a semiconductor structure is provided. The method includes forming a plurality of fin stacks on a substrate. Each of the plurality of fin stacks includes a semiconductor fin and a fin cap. A bottom portion of each semiconductor fin is laterally surrounded by an insulator layer. Sacrificial spacers are then formed on sidewalls of the semiconductor fins that are not covered by the insulator layer. Next, the insulator layer is recessed to provide an insulator layer portion. A gap is formed between each sacrificial spacer and the insulator layer portion. Each gap exposes sidewalls of a portion of the bottom portion of each semiconductor fin. Next, a portion of the bottom portion of each semiconductor fin is doped to form a source region therein. Each gap exposes sidewalls of each source region. Lower-level local interconnects are then formed over the insulator layer portion to connect the source regions. Each of the lower-level local interconnects fills the gap and contacts sidewalls of adjacent source regions. After forming a dielectric layer to cover the lower-level local interconnects, the sacrificial spacers are removed to expose sidewalls of a non-doped portion of each semiconductor fin. Next, a metal gate is formed along sidewalls of a lower portion of the non-doped portion of each semiconductor fin and upper-level local interconnects are formed connecting the metal gates. Each of the upper-level local interconnects contact sidewalls of adjacent metal gates. An upper portion of the non-doped portion of each semiconductor fin is then doped to form a drain region therein.

BRIEF DESCRIPTION OF SEVERAL VIEWS OF THE DRAWINGS

FIG. 12A is a top-down view of the exemplary semiconductor structure of FIGS. 11A and 11B after patterning the gate electrode layer to form a first gate electrode portion that laterally surrounds a lower portion of each non-doped semiconductor fin portion and a second gate electrode portion that connects adjacent first gate electrode portions.

FIG. 12B is a cross-sectional view of the exemplary semiconductor structure of FIG. 12A along line B-B'.

FIG. 12C is a cross-sectional view of the exemplary semiconductor structure of FIG. 12A along line C-C'.

FIG. 14A is a top-down view of the exemplary semiconductor structure of FIGS. 13A-13C after forming a second dopant-rich layer contacting sidewalls of the non-doped semiconductor fin portions that are not covered by the metal gates and diffusing dopants in the second dopant-rich layer into the non-doped semiconductor fin portions to form a drain region at a top portion of each semiconductor fin.

FIG. 14B is a cross-sectional view of the exemplary semiconductor structure of FIG. 14A along line B-B'.

FIG. 14C is a cross-sectional view of the exemplary semiconductor structure of FIG. 14A along line C-C'.

FIG. 15A is a top-down view of the exemplary semiconductor structure of FIGS. 14A-14C after forming a contact level dielectric layer over the second dopant-rich layer.

FIG. 15B is a cross-sectional view of the exemplary semiconductor structure of FIG. 15A along line B-B'.

FIG. 15C is a cross-sectional view of the exemplary semiconductor structure of FIG. 15A along line C-C'.

FIG. 16A is a top-down view of the exemplary semiconductor structure of FIGS. 15A-15C after forming gate, source and drain contact structures.

FIG. 16B is a cross-sectional view of the exemplary semiconductor structure of FIG. 16A along line B-B'.

FIG. 16C is a cross-sectional view of the exemplary semiconductor structure of FIG. 16A along line C-C'.

DETAILED DESCRIPTION

Figure 1A:
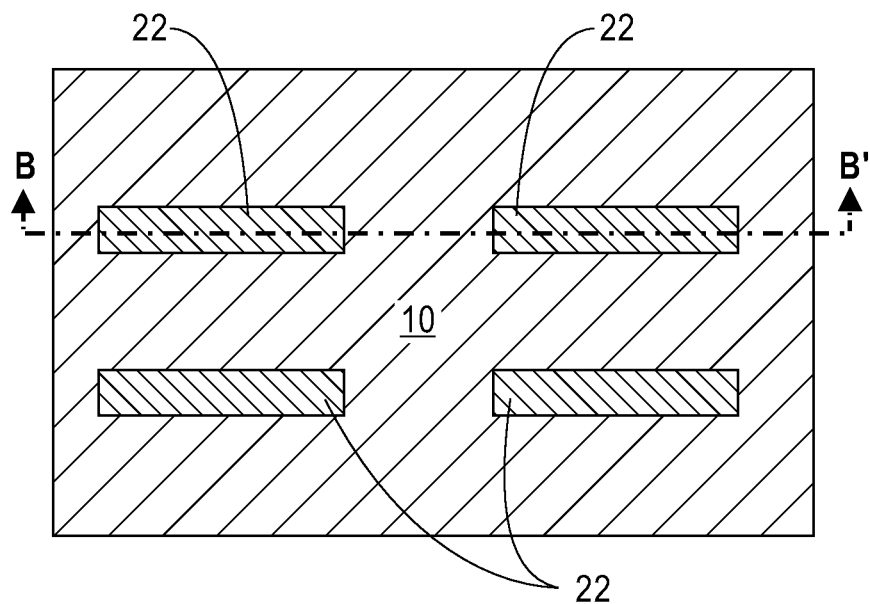
FIG. 1A is a top-down view of an exemplary semiconductor structure including a plurality of fin stacks located on a substrate according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
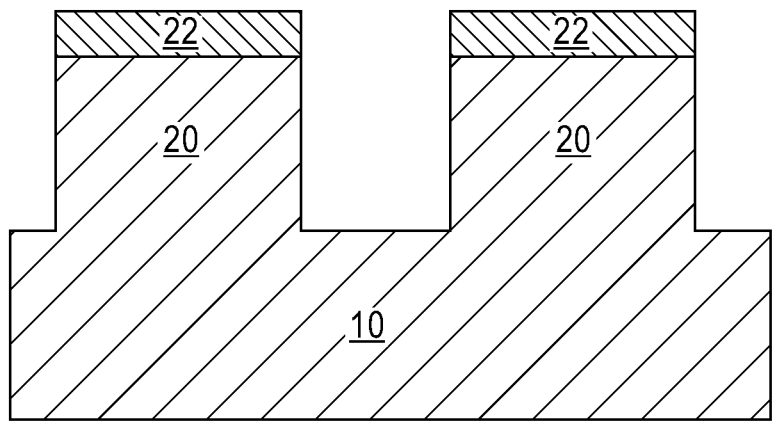
FIG. 1B is a cross-sectional view of the exemplary semiconductor structure of FIG. 1A along line B-B'.

Referring to FIGS. 1A and 1B, an exemplary semiconductor structure according to an embodiment of the present application includes a plurality of fin stacks formed on a substrate 10. Each fin stack includes a semiconductor fin 20 and a fin cap 22 located on top of the semiconductor fin 20. The semiconductor fins 20 may have a width ranging from 5 nm to approximately 100 nm, although lesser and greater widths can also be employed; and may have a height ranging from 10 nm to approximately 200 nm, although lesser and greater heights can also be employed. The semiconductor fins 20 may be separated by a spacing ranging from 30 nm to 50 nm, although lesser and greater distances can also be employed.

The fin stacks (20, 22) and can be formed by first forming a dielectric cap layer (not shown) on a topmost surface of the substrate 10. In one embodiment and as shown in FIG. 1B, the substrate 10 can be a bulk semiconductor substrate including a bulk semiconductor material throughout. The bulk semiconductor substrate may include a semiconductor material such as, for example, Si, Ge, SiGe, SiC, SiGeC or an III-V compound semiconductor. In one embodiment, the bulk semiconductor substrate includes a single crystalline semiconductor material, such as, for example, single crystalline silicon. The thickness of the bulk semiconductor substrate can be from 30 μm to about 2 mm, although lesser and greater thicknesses can also be employed.

The bulk semiconductor substrate may be doped with dopants of p-type or n-type. In one embodiment, the dopants may be a p-type dopant including, but not limited to, boron (B), aluminum (Al), gallium (Ga), and indium (In). In another embodiment, the dopants may be an n-type dopant including, but not limited to, antimony (Sb), arsenic (As), and phosphorous (P). The dopant concentration in the bulk semiconductor substrate can range from $1\times10^{14}$ atoms/cm$^3$ to $3\times10^{17}$ atoms/cm$^3$, although lesser and greater dopant concentrations can also be employed.

The dielectric cap layer may include a dielectric material such as, for example, silicon dioxide, silicon nitride, silicon oxynitride, a dielectric metal oxide, or a combination thereof. In one embodiment, the dielectric cap layer is composed of silicon nitride. The dielectric cap layer can be formed by a deposition process including chemical vapor deposition (CVD), plasma-enhanced chemical vapor deposition (PECVD) or physical vapor deposition (PVD), or by a thermal growing process, such as thermal oxidation or thermal nitridation, to convert a surface portion of the bulk semiconductor substrate. The thickness of the dielectric cap layer can be from 5 nm to 20 nm, although lesser and greater thicknesses can also be employed.

The dielectric cap layer and an upper portion of the bulk semiconductor substrate are subsequently patterned to form the fin stacks (20, 22). For example, a photoresist layer (not shown) can be applied over a top surface of the dielectric cap layer and lithographically patterned to provide a patterned photoresist layer atop portions of the dielectric cap layer. Portions of the dielectric cap layer that are not covered by the patterned photoresist layer are subsequently removed by an anisotropic etch, exposing portions of the bulk semiconductor substrate. The anisotropic etch can be a dry etch such as, for example, reactive ion etch (RIE) or a wet etch involving a chemical etchant that removes dielectric material of the dielectric cap layer selective to the semiconductor material of the bulk semiconductor substrate. Remaining portions of the dielectric cap layer after the lithographic patterning constitute the fin caps 22. Another anisotropic etch is then performed to remove semiconductor material from the bulk semiconductor substrate utilizing the fin caps 22 as an etch mask, thus forming the semiconductor fins 20 in the upper portion of the bulk semiconductor substrate. After transferring the pattern in the photoresist layer into the dielectric cap layer and the bulk semiconductor substrate, the patterned photoresist layer can be removed utilizing a conventional resist stripping process such as, for example, ashing. Other methods known in the art, such as sidewall image transfer (SIT) or directional self-assembly (DSA), can also be used to pattern the dielectric cap layer and the bulk semiconductor substrate to provide the fin caps 22 and the semiconductor fins 20, respectively.

In another embodiment, the substrate 10 can be a semiconductor-on-insulator (SOI) substrate including, from bottom to top, a handle substrate, a buried insulator layer and a top semiconductor layer (not shown). The semiconductor fins 20 are formed by etching the top semiconductor layer. In such case, the semiconductor fins 20 may extend upwards from the buried insulator layer.

Figure 2A:
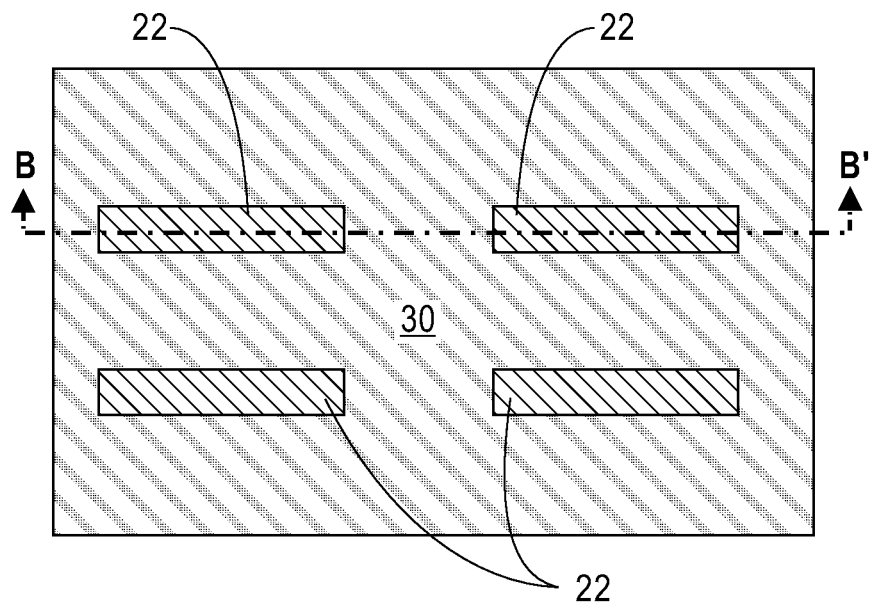
FIG. 2A is a top-down view of the exemplary semiconductor structure of FIGS. 1A and 1B after forming an insulator layer around the base of each semiconductor fin in the fin stacks.
Figure 2B:
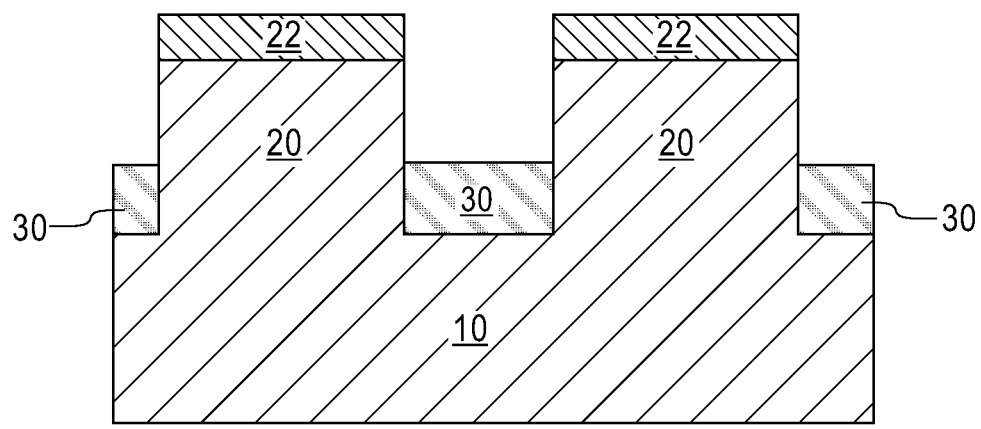
FIG. 2B is a cross-sectional view of the exemplary semiconductor structure of FIG. 2A along line B-B'.

Referring to FIGS. 2A and 2B, an insulator layer 30 is formed around the base of each semiconductor fin 20, so that bottom portions of the semiconductor fins 20 are covered by the insulator layer 30. Thus, the insulator layer 30 has a topmost surface that is vertical offset and located beneath a topmost surface of each semiconductor fin 20. The insulator layer 30 may have a thickness ranging from 50 nm to 80 nm, although lesser and greater thicknesses can also be employed.

The insulator layer 30 may be composed of any dielectric material capable of being removed selectively to the semiconductor fins 20, the fin caps 22, as well as sacrificial spacers to be subsequently formed on sidewalls of the semiconductor fins 20, as described below in conjunction with FIGS. 3A and 3B. In one embodiment, the insulator layer 30 includes a dielectric oxide such as, for example, silicon dioxide. The insulator layer 30 may be formed by depositing a dielectric material over and between the semiconductor fins 20 using a conventional deposition technique, such as, for example, CVD or PVD, planarizing the deposited dielectric material by a conventional planarization technique such as, for example chemical mechanical planarization (CMP), and then etching back the deposited dielectric material to the desired thickness. An anisotropic etch such as, for example, RIE may be employed to remove the dielectric material of the insulator layer 30 selective to the material of the semiconductor fins 20 and the fin caps 22.

Figure 3A:
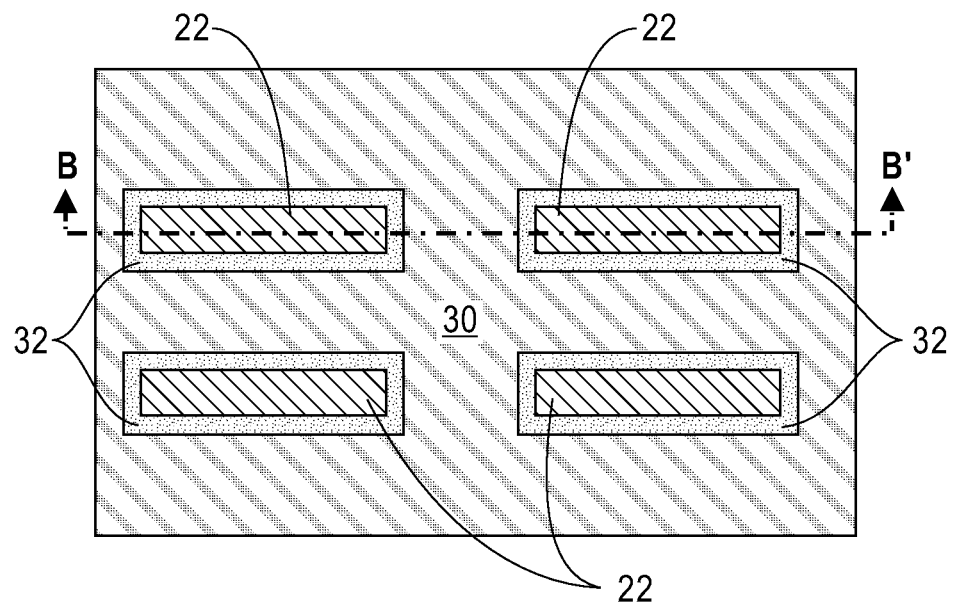
FIG. 3A is a top-down view of the exemplary semiconductor structure of FIGS. 2A and 2B after forming sacrificial spacers on sidewalls of the semiconductor fins above the insulator layer.
Figure 3B:
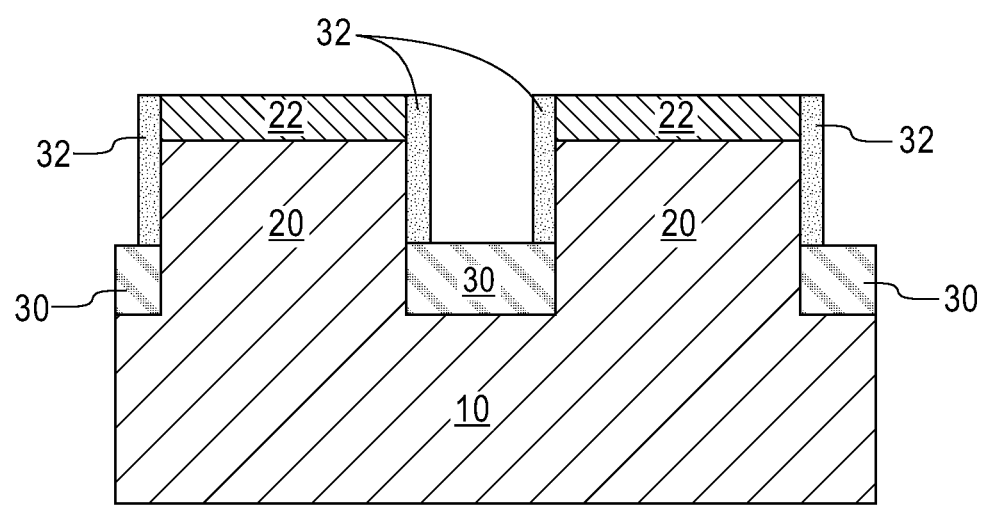
FIG. 3B is a cross-sectional view of the exemplary semiconductor structure of FIG. 3A along line B-B'.

Referring to FIGS. 3A and 3B, sacrificial spacers 32 are formed on the sidewalls of the semiconductor fins 20 above the insulator layer 30. The sacrificial spacers 32 may include a dielectric material that differs from the dielectric material that provides insulator layer 30. Exemplary dielectric materials that can be used in providing the sacrificial spacers 32 include, but are not limited to, an oxide, a nitride and an oxynitride. In one embodiment, the sacrificial spacers 32 are composed of silicon nitride.

The sacrificial spacers 32 can be formed by first conformally depositing a sacrificial spacer material layer (not shown) on exposed surfaces of the each fin stack including the semiconductor fin 20 and fin cap 22 (i.e., top surfaces and sidewall surfaces of the semiconductor fins 20 not covered by the insulator layer 30 and top surfaces and sidewall surfaces of the fin caps 22) and the insulator layer 30 utilizing, for example, CVD or atomic layer deposition (ALD). Subsequently, horizontal portions of the conformal sacrificial spacer material layer are removed by an anisotropic etch such as, for example, RIE. Remaining vertical portions of the conformal sacrificial spacer material layer that are present on sidewalls of the exposed portions of the semiconductor fins 20 constitute the sacrificial spacers 32. The sacrificial spacers 32 can have a width, as measured at the base, from 10 nm to 20 nm, although lesser and greater widths can also be employed. As is shown, the sacrificial spacers 32 have a topmost surface that is coplanar with a topmost surface of the fin caps 22.

Figure 4A:
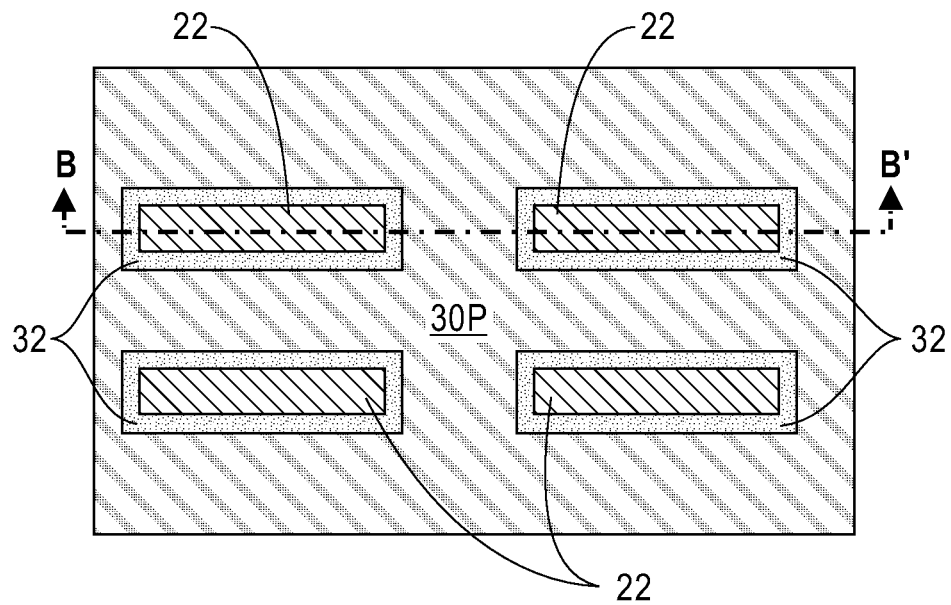
FIG. 4A is a top-down view of the exemplary semiconductor structure of FIGS. 3A and 3B after recessing the insulator layer to provide an insulator layer portion, thus forming gaps between the sacrificial spacers and the insulator layer portion.
Figure 4B:
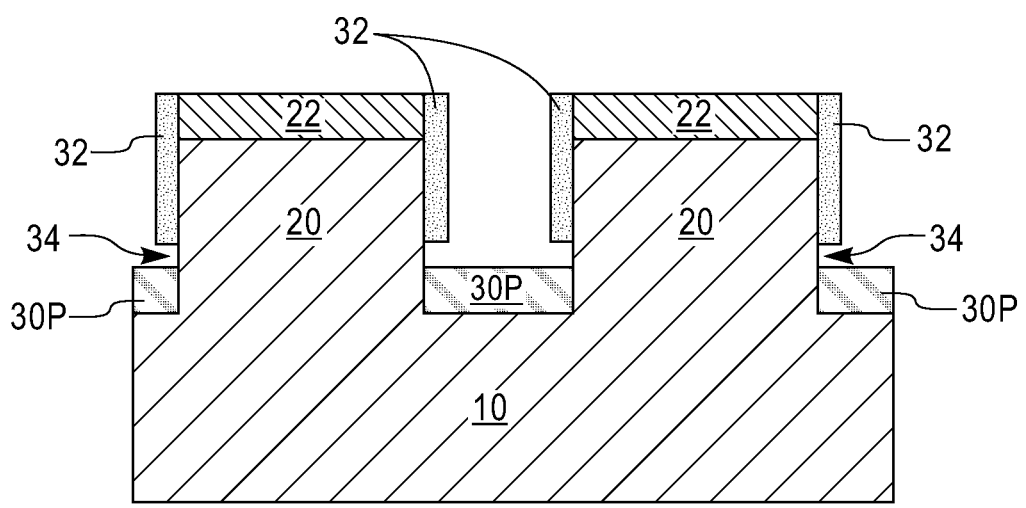
FIG. 4B is a cross-sectional view of the exemplary semiconductor structure of FIG. 4A along line B-B'.

Referring to FIGS. 4A and 4B, the insulator layer 30 is recessed so that a top surface of a remaining portion of the insulator layer 30 (herein referred to as an insulator layer portion 30P) is located below the bottom surfaces of the sacrificial spacers 32. As such, gaps 34 are formed between the sacrificial spacers 32 and the insulator layer portion 30P, exposing sidewalls of portions of the bottom portions of the semiconductor fins 20 that are originally covered by the insulator layer 30. The insulator layer 30 may be recessed using an anisotropic etch. The anisotropic etch can be a dry etch or a wet etch that removes the dielectric material of the insulator layer 30 without substantially impacting the surrounding structure, including the semiconductor fins 20, the fin caps 22 and the sacrificial spacers 32. In one embodiment, RIE may be performed. After recessing, the insulator layer portion 30P may have a thickness from 10 nm to 30 nm, although lesser and greater thicknesses can also be employed.

Figure 5A:
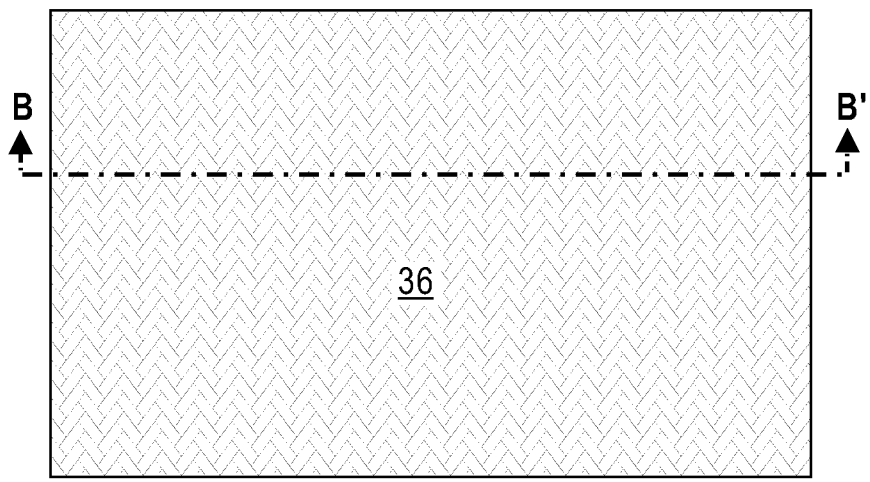
FIG. 5A is a top-down view of the exemplary semiconductor structure of FIGS. 4A and 4B after forming a first dopant-rich layer contacting sidewalls of the semiconductor fins exposed by the gaps and diffusing dopants in the first dopant-rich layer into the semiconductor fins to form a source region at a bottom portion of each semiconductor fin.
Figure 5B:
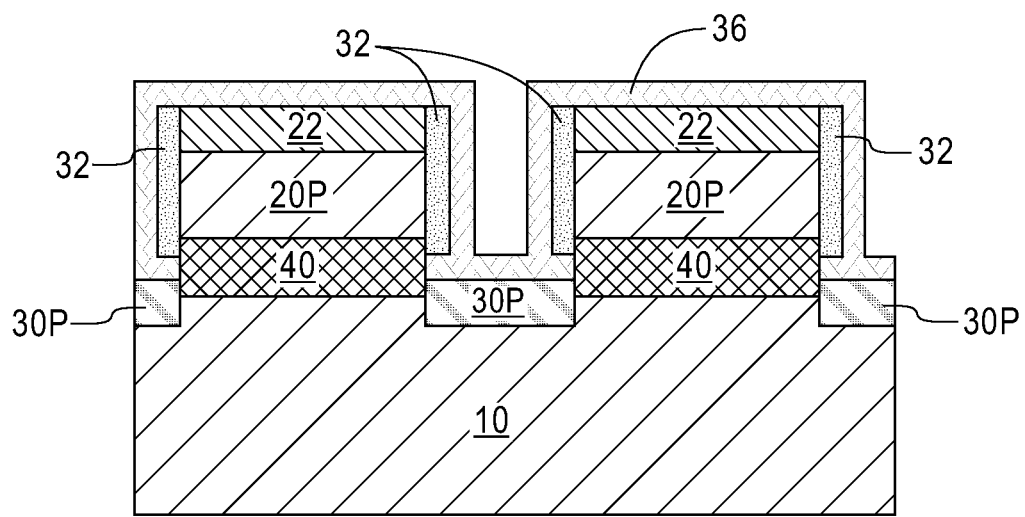
FIG. 5B is a cross-sectional view of the exemplary semiconductor structure of FIG. 5A along line B-B'.

Referring to FIGS. 5A and 5B, a first dopant-rich layer 36 is applied on the insulator layer portion 30P, the sacrificial spacers 32 and the fin caps 22 and within the gaps 34. The first dopant-rich layer 36 thus contacts the sidewalls of the exposed lower portions of the semiconductor fins 20. The first dopant-rich layer 36 serves as a dopant diffusion source during an anneal process subsequently performed for formation of a source region in each semiconductor fin 20. Depending on the desirable conductivity type of the resulting FinFETs, the first dopant-rich layer 36 may include n-type dopants or p-type dopants. For example, for n-type FinFET, the first dopant-rich layer 36 may comprise phosphorous and/or arsenic, while for p-type FinFET, the first dopant-rich layer 36 may comprises boron and/or In. The concentration of the dopants in the first dopant-rich layer 36 may be greater than 80 atomic %. In one embodiment, the first dopant-rich layer 36 may include phosphorus-doped silicate glass (PSG) or boron-doped silicate glass (BSG). In another embodiment, the first dopant-rich layer 36 may include doped silicon.

The first dopant-rich layer 36 can be applied, for example, by CVD. The thickness of the first dopant-rich layer 36 can be from 5 nm to 100 nm, although lesser and greater thicknesses can also be employed.

After the formation of the first dopant-rich layer 36, an anneal is performed to drive dopants in the first dopant-rich layer 36 into the semiconductor fins 20 to form a source region 40 at the bottom portion of each semiconductor fin 20. The anneal process can be performed at a temperature ranging from 900° C. to 1150° C. The source regions 40 can have a dopant concentration ranging from $1 \times 10^{18}$ atoms/cm$^3$ to $1\times10^{21}$ atoms/cm$^3$. The undoped portions of the semiconductor fins 20 are herein referred to as non-doped semiconductor fin portions 20P.

Figure 6A:
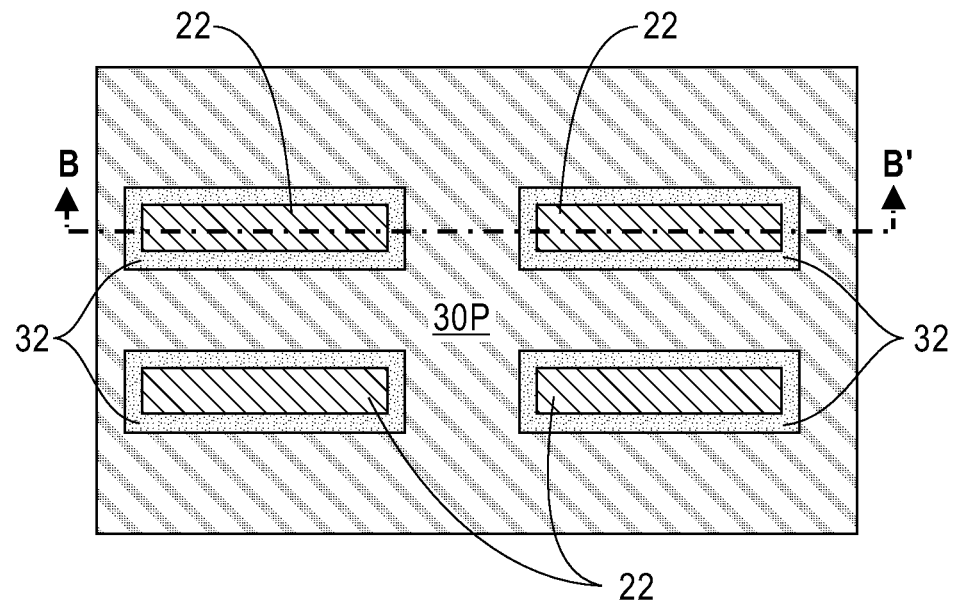
FIG. 6A is a top-down view of the exemplary semiconductor structure of FIGS. 5A and 5B after removing the first dopant-rich layer to re-expose sidewalls of the semiconductor fins in the gaps.
Figure 6B:
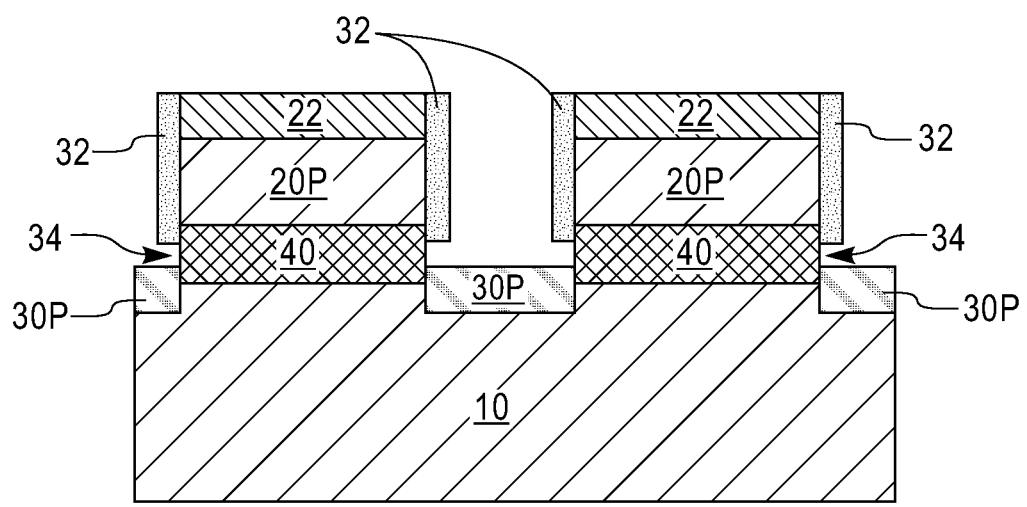
FIG. 6B is a cross-sectional view of the exemplary semiconductor structure of FIG. 6A along line B-B'.

Referring to FIGS. 6A and 6B, the first dopant-rich layer 36 is removed from the fin caps 22, the sacrificial spacers 22, the insulator layer portion 30P and the gaps 34. Sidewall surfaces of the source regions 40 are thus exposed in the gaps 34. In one embodiment, the first dopant-rich layer 36 can be removed by a wet etch based on, for example, dilute hydrofluoric acid (HF) or buffer HF chemistry. In instances where the first dopant-rich layer 36 is composed of doped silicon, the step of removing the first dopant-rich layer 36 can be omitted.

Figure 7A:
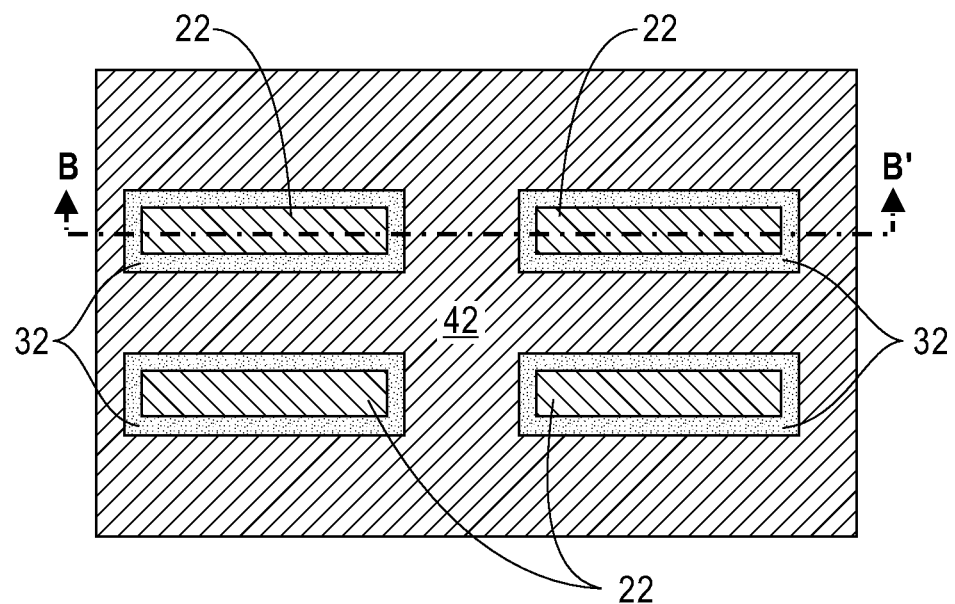
FIG. 7A is a top-down view of the exemplary semiconductor structure of FIGS. 6A and 6B after forming a metal layer over the insulator layer portion and within the gaps to contact sidewalls of the source regions.
Figure 7B:
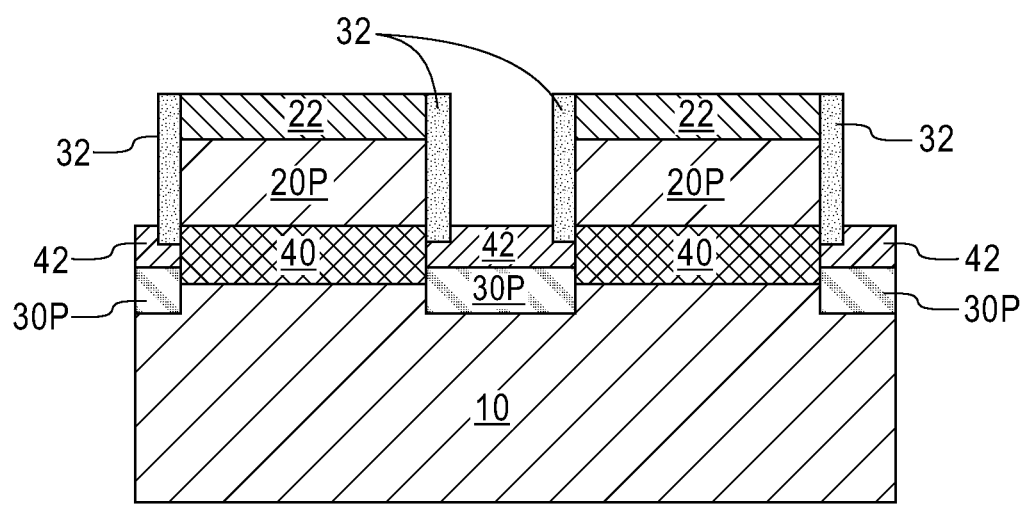
FIG. 7B is a cross-sectional view of the exemplary semiconductor structure of FIG. 7A along line B-B'.

Referring to FIGS. 7A and 7B, a metal layer 42 is formed over the insulator layer portion 30P and within the gaps 34, contacting sidewalls of the source regions 40. The metal layer 42 is optional and can be omitted in instances where the first dopant-rich layer 36 is composed of doped silicon and remains in the structure after formation of the source regions 40.

The metal layer 42, if present, may include a conductive metal such as Cu, W, Al, or an alloy thereof. The metal layer 42 may be formed by first depositing a conductive metal utilizing a convention deposition process including, but not limited to CVD, PECVD, PVD, or plating. The thickness of the metal layer 42 can be selected so that an entire metal layer 42 is formed above the top surfaces of the fin caps 22. Subsequently, the metal layer 42 is planarized, for example, by CMP, and recessed by a recess etch. The etch can be a dry etch or a wet etch that removes the conductive metal selective to the dielectric materials that provide the fin caps 22 and the sacrificial spacers 32 and the semiconductor material that provides the semiconductor fins 20. After recessing, the metal layer 42 has a top surface coplanar with or below the top surfaces of the source regions 40. Optionally, a metal liner (not shown) may be formed over the insulator layer portion 30 prior to the deposition of the conductive metal that provides the metal layer 42. The metal liner may include Co, Ni or Pt.

Figure 8A:
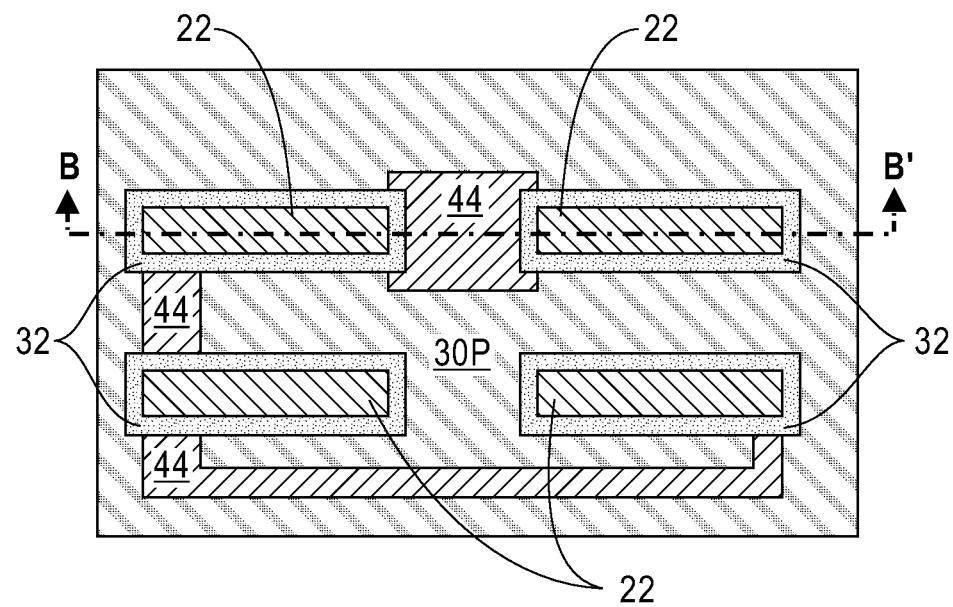
FIG. 8A is a top-down view of the exemplary semiconductor structure of FIGS. 7A and 7B after patterning the metal layer to form lower-level local interconnects connecting the source regions.
Figure 8B:
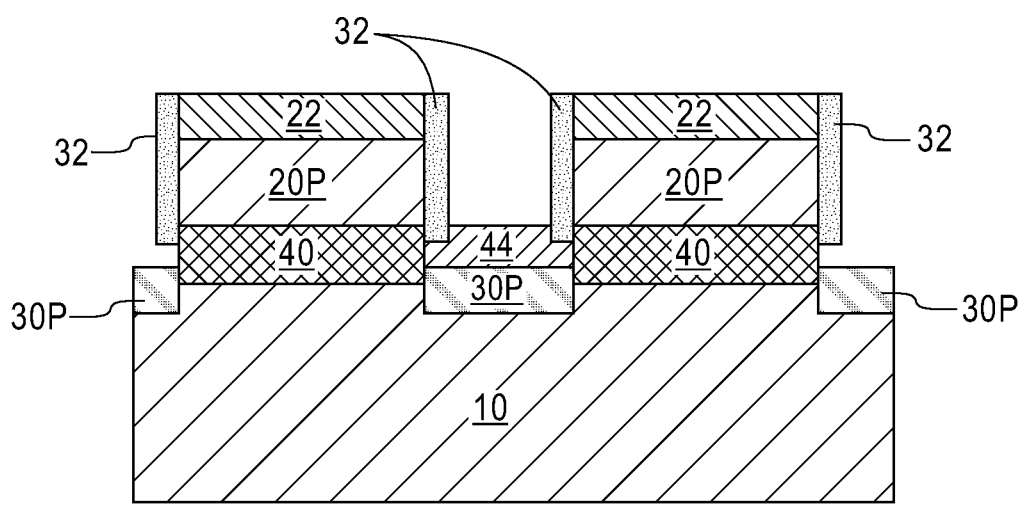
FIG. 8B is a cross-sectional view of the exemplary semiconductor structure of FIG. 8A along line B-B'.

Referring to FIGS. 8A and 8B, the metal layer 42, or in some embodiments the first dopant-rich layer 36 if the metal layer 42 is not present, is patterned to form lower-level local interconnects 44 that connect individual source regions 40 which are located beneath each neighboring pair of the non-doped semiconductor fin portions 20P. Specifically, a photoresist layer (not shown) is applied over the metal layer 42 or the first dopant-rich layer 36, the fin caps 22 and the sacrificial spacers 32 and then lithographically patterned so that remaining portions of the photoresist layer covers portions of the metal layer 42 or the first dopant-rich layer 36 where the lower-level local interconnects 44 are to be formed. The pattern in the photoresist layer is transferred through the metal layer 42 or the first dopant-rich layer 36 by an anisotropic etch. The anisotropic etch can be a dry etch such as, for example, RIE or a wet etch. After the anisotropic etch, remaining portions of the metal layer 42 or remaining portions of the first-dopant rich layer 36 constitute the lower-level local interconnects 44. The remaining portions of the photoresist layer can be subsequently removed, for example, by ashing.

Figure 9A:
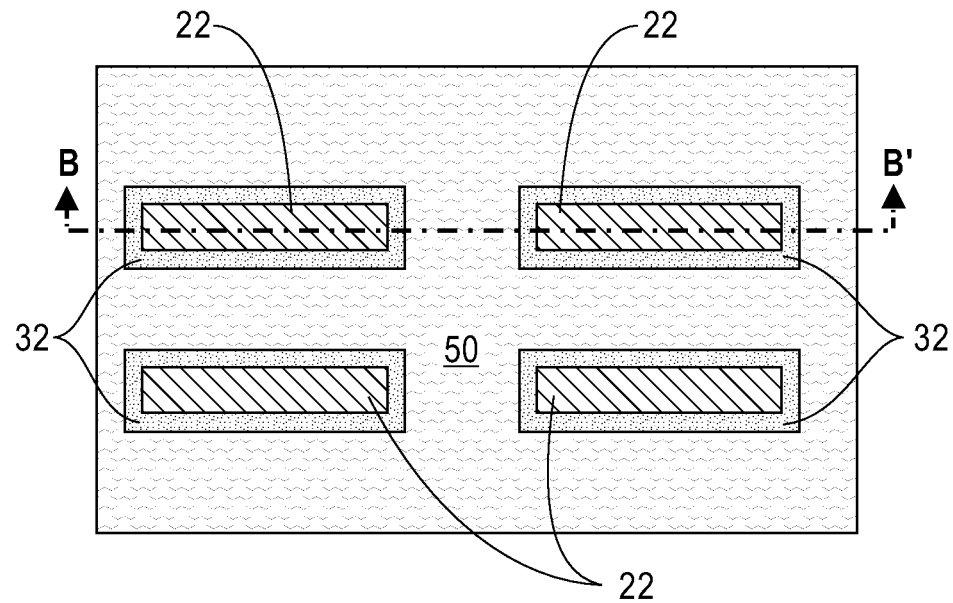
FIG. 9A is a top-down view of the exemplary semiconductor structure of FIGS. 8A and 8B after forming a dielectric layer to cover the lower-level local interconnects.
Figure 9B:
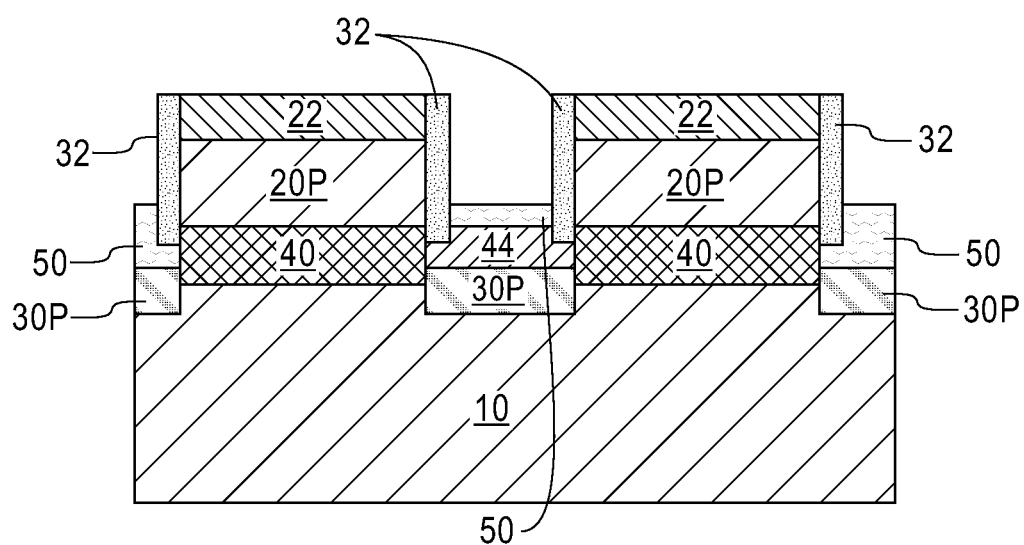
FIG. 9B is a cross-sectional view of the exemplary semiconductor structure of FIG. 9A along line B-B'.

Referring to FIGS. 9A and 9B, a dielectric layer 50 is formed over the insulator layer portion 30P to cover the lower-level local interconnects 44. As is shown, a topmost surface of the dielectric layer 50 is located below the top surfaces of the semiconductor fin portions 20P. In one embodiment, the dielectric layer 50 may have a thickness around 15 nm.

The dielectric material of the dielectric layer 50 may be chosen so the sacrificial spacers 32 may be selectively removed without substantially removing the dielectric layer 50. For example and when the sacrificial spacers 32 include a dielectric nitride, the dielectric layer 50 may include a dielectric oxide such as silicon dioxide. In one embodiment, the dielectric layer 50 may be made of the same dielectric material as the insulator layer portion 30P, so that the dielectric layer 50 is indistinguishable for the insulator layer portion 30P after deposition.

The dielectric layer 50 can be formed utilizing a sequence of deposition and etch back processes. The dielectric material that provides the dielectric layer 50 may be first deposited, for example, by CVD or PVD. After deposition, the deposited dielectric material is recessed by a selective etch to provide the dielectric layer 50. The selective etch can be an anisotropic etch such as RIE that removes the dielectric material that provides the dielectric layer 50 selective to the dielectric materials that provide the fin caps 22 and the sacrificial spacers 32.

Figure 10A:
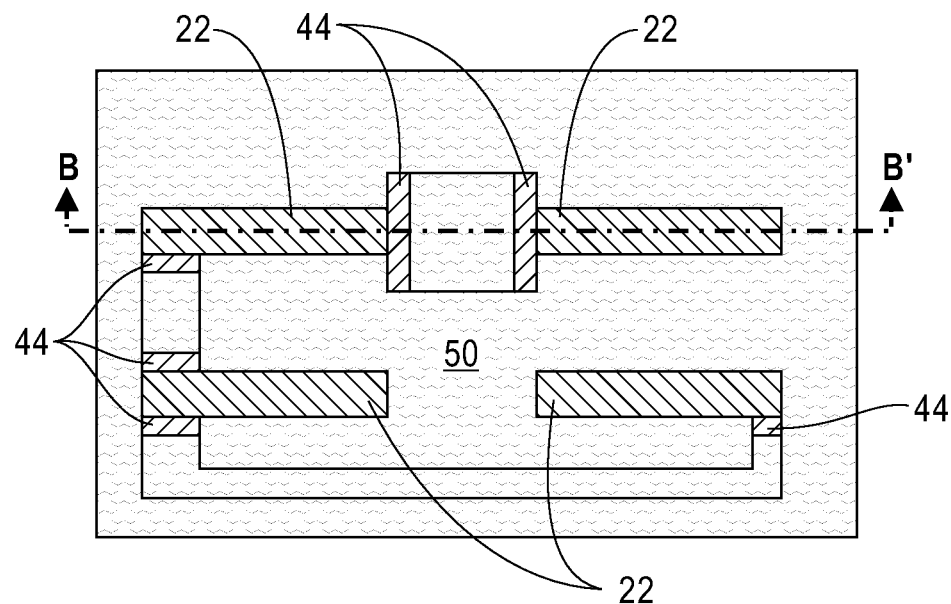
FIG. 10A is a top-down view of the exemplary semiconductor structure of FIGS. 9A and 9B after removing the sacrificial spacers.
Figure 10B:
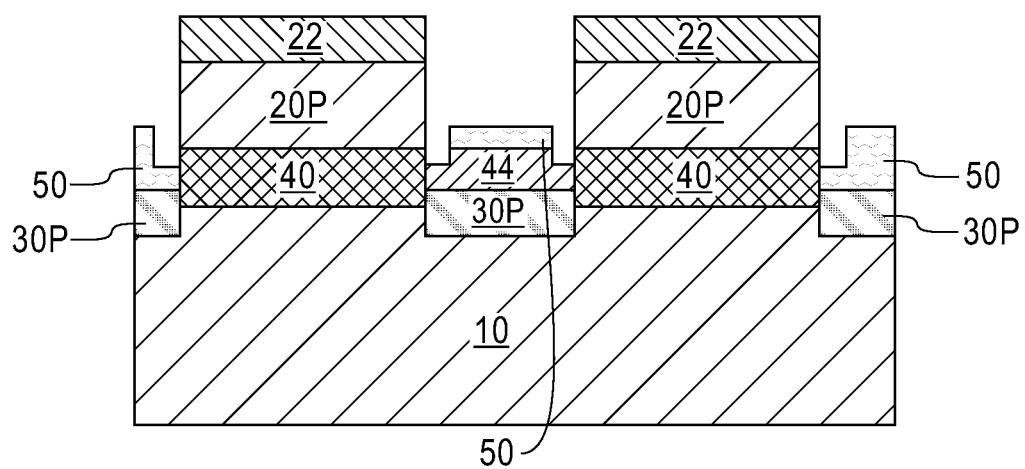
FIG. 10B is a cross-sectional view of the exemplary semiconductor structure of FIG. 10A along line B-B'.

Referring to FIGS. 10A and 10B, the sacrificial spacers 32 are removed from the sidewalls of the semiconductor fin portions 20P and fin caps 22 by an etch, which can be an isotropic etch or an anisotropic etch. In one embodiment, the sacrificial spacers 32 can be removed by a wet etch. For example, if the sacrificial spacers 32 include silicon nitride, the sacrificial spacers 32 can be removed by a wet etch employing hot phosphoric acid. Depending on selection of the materials for the sacrificial spacers 32 and the fin caps 22, portions of the fin caps 22 may, or may not be, collaterally etched. The removal the sacrificial spacers 32 exposes sidewalls of a portion of each vertical fin stack (20P, 22). That is, sidewalls of each non-doped semiconductor fin portion 20P and sidewalls of each fin cap 22 are exposed. In some embodiments of the present application and as shown in FIG. 10B, sidewalls of a portion of each source region 42 are also exposed. In addition to exposing each fin stack (20P, 22), the removal of the sacrificial spacers 32 also exposes a portion of each lower-level local interconnect 44 adjoined to the source regions 40.

Figure 11A:
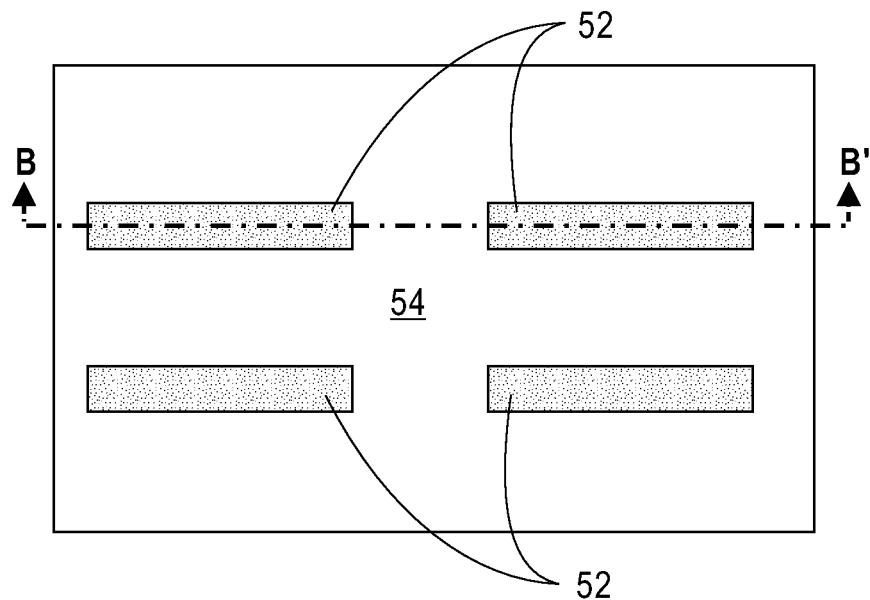
FIG. 11A is a top-down view of the exemplary semiconductor structure of FIGS. 10A and 10B after forming a gate dielectric layer and a gate electrode layer.
Figure 11B:
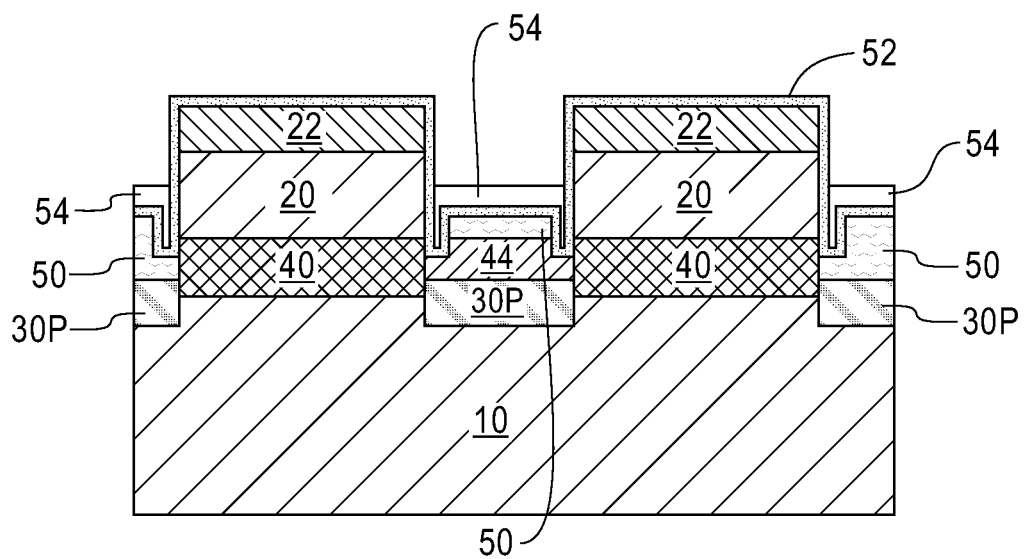
FIG. 11B is a cross-sectional view of the exemplary semiconductor structure of FIG. 11A along line B-B'.

Referring to FIGS. 11A and 11B, a gate dielectric layer 52 is formed on exposed surfaces of the fin caps 22, the non-doped semiconductor fin portions 20, the source regions 40, the lower-level local interconnects 44 and the dielectric layer 50. In one embodiment, the gate dielectric layer 52 can be composed of silicon dioxide, silicon nitride and/or silicon oxynitride. In another embodiment, the gate dielectric layer 52 can be composed of a dielectric metal oxide, so called high dielectric constant (high-k) material having a dielectric constant greater than 8.0. Exemplary dielectric metal oxides that can be used as the gate dielectric material that provides the gate dielectric layer 52 include, but are not limited to, $HfO_2$, $ZrO_2$, $La2O_3$, $Al_2O_3$, $TiO_2$, $SrTiO_3$, $LaAlO_3$ and $Y_2O_3$. In some embodiments, the gate dielectric layer 52 may have a multilayer structure comprising different gate dielectric materials, e.g., silicon dioxide, and a dielectric metal oxide can be formed and used as the gate dielectric material that provides the gate dielectric layer 52.

In one embodiment of the present application, the gate dielectric layer 52 can be formed by a conventional deposition process including, but not limited to, CVD, PVD and atomic layer deposition (ALD). In another embodiment of the present application, the gate dielectric layer 52 can be formed by a thermal growth technique such as, for example, thermal oxidation and/or thermal nitridation. In yet a further embodiment of the present application, a combination of a deposition and thermal growth may be used in forming a multilayered gate dielectric layer. The gate dielectric layer that is formed may have a thickness ranging from 1 nm to 10 nm, although lesser and greater thicknesses can also be employed.

Subsequently, a gate electrode layer 54 is formed on the gate dielectric layer 52. The gate electrode layer 54 may comprise any conductive metal. Exemplary conductive metals that can be employed in the metal gate electrode layer include, but are not limited to, W, Ti, Ta, Al, Ni, Ru, Pd and Pt. In one embodiment, the gate electrode layer is comprised of W. In some embodiments of the present application, the ate electrode layer 54 also contains a work function material such as, for example, TiAlN, TiN, or TaN.

The gate electrode layer 54 can be formed utilizing a sequence of deposition and etch back processes. The gate electrode layer 54 can be deposited by a conventional deposition process including, for example, CVD, PECVD, PVD, sputtering, chemical solution deposition and ALD. Subsequently, the gate electrode layer 54 is planarized, for example, by CMP, and recessed by a recess etch. The etch can be a dry etch or a wet etch that removes the conductive metal that provides the gate electrode layer 54 selective to the dielectric material(s) that provides the gate dielectric layer 52. The gate electrode layer 54 has a top surface located between the top surfaces of the non-doped semiconductor fin portions 20P and top surfaces of the source regions 40.

Referring to FIGS. 12A-12C, the gate electrode layer 54 is patterned to form a first gate electrode portion 54A that laterally surrounds a lower portion of each non-doped semiconductor fin portion 20P and a second gate electrode portion 54B that connects adjacent first gate electrode portions 54A. A photoresist layer (not shown) is first applied over the gate electrode layer 54. The photoresist layer is lithographically patterned so that remaining portions of the photoresist layer covers portions of the gate electrode layer 54 where the first and the second gate electrode portions 54A, 54B are to be formed. An anisotropic etch is performed to remove the portions of the gate electrode layer 54 that are not covered by the photoresist layer. The anisotropic etch can be a dry etch such as, for example, RIE or a wet etch. After the anisotropic etch, each remaining portion of the gate electrode layer 54 that is in direct contact with sidewalls of each non-doped semiconductor fin portion 20 constitutes the first gate electrode portion 54A, while a remaining portion of the gate electrode layer 54 located between adjacent first gate electrode portions 54A constitutes the second gate electrode portion 54B. The remaining portion of the photoresist layer can be subsequently removed, for example, by ashing.

Figure 13C:
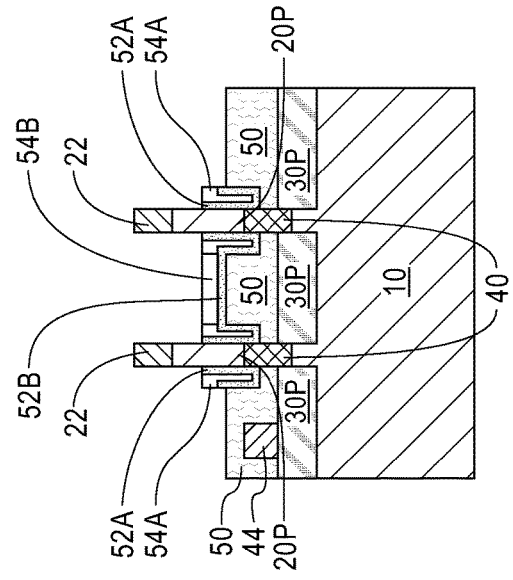
FIG. 13C is a cross-sectional view of the exemplary semiconductor structure of FIG. 13A along line C-C'.
Figure 13A:
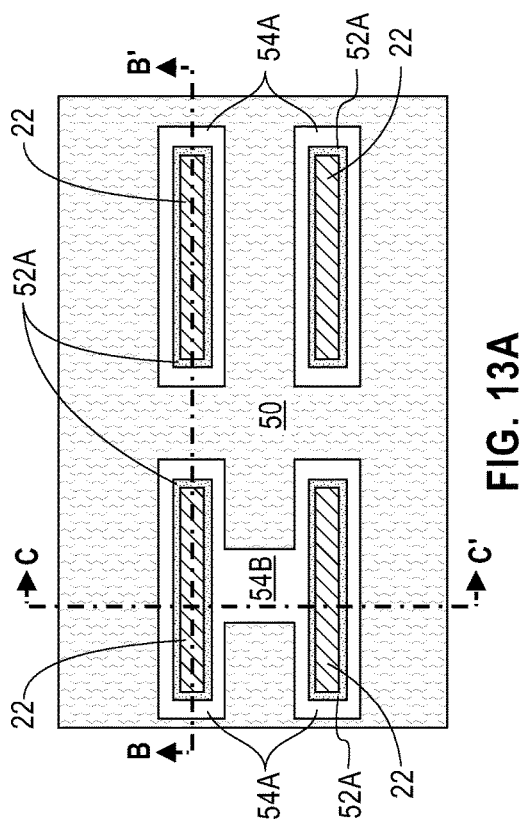
FIG. 13A is a top-down view of the exemplary semiconductor structure of FIGS. 12A-12C after forming a metal gate laterally surrounds the lower portion of each non-doped semiconductor fin portion and an upper-level local interconnect that connects adjacent metal gates.
Figure 13B:
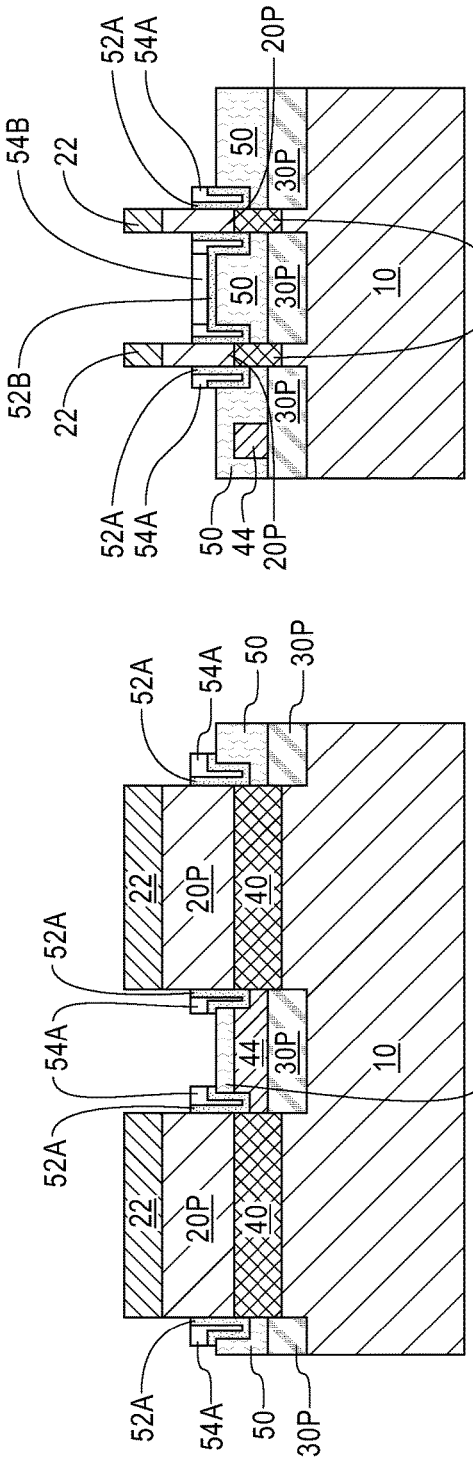
FIG. 13B is a cross-sectional view of the exemplary semiconductor structure of FIG. 13A along line B-B'.

Referring to FIGS. 13A-13C, portions of the gate dielectric layer 52 that are not covered by the first and second gate electrode portions 54A, 54B are removed by an anisotropic etch. The anisotropic etch can be a dry etch or a wet etch that removes the dielectric material that provides the gate dielectric layer 52 selective to the dielectric materials of the fin caps 22 and the dielectric layer 50 and semiconductor material of the semiconductor fin 20. In one embodiment, RIE is performed. Each remaining portion of the gate dielectric layer 52 that is located beneath one of the first gate electrode portions 54A constitutes a first gate dielectric portion 52A, while a remaining portion of the gate dielectric layer 52 that is located beneath the second gate electrode portion 54B constitutes a second gate dielectric portion 52B. A first gate dielectric portion 52A and an overlying first gate electrode portion 54A together define a metal gate contacting sidewalls of a portion of each non-doped semiconductor fin portion 20P. The second gate dielectric portion 52B and the overlying second gate electrode portion 54B together define an upper-level local interconnect connecting adjacent metal gates (52A, 54A). In the present application, although only one upper-level local interconnect (52B, 54B) is shown, it can be understood that a plurality of upper-level local interconnect (52B, 54B) can be formed to connect individual metal gates (52A, 54A).

Referring to FIGS. 14A-14C, a second dopant-rich layer 58 is deposited on the exposed surfaces of the dielectric layer 50, the metal gates (52A, 54A), the upper-level local interconnect (52B, 54B), the non-doped semiconductor fin portions 20P and the fin caps 22. The second dopant-rich layer 58 thus contacts sidewalls of the top portions of the non-doped semiconductor fin portions 20P that are not covered by the metal gates (52A, 52B). The second dopant-rich layer 58 serves as a dopant diffusion source during an anneal process subsequently performed for formation of a drain region in each semiconductor fin 20.

The second dopant-rich layer 58 typically comprises a dielectric material containing dopants of the same conductivity type as that of the dopants in the first dopant-rich layer 36. In one embodiment, the second dopant-rich layer 58 includes phosphorus-doped silicate glass (PSG) or boron-doped silicate glass (BSG). The second dopant-rich layer 58 can be formed by performing processing steps described above in formation of dopant-rich layer 36. For example, the second dopant-rich layer 58 can be formed by CVD or spin coating.

Subsequently, an anneal is performed to drive dopants in the second dopant-rich layer 58 into the non-doped semiconductor fin portions 20P to form a drain region 60 at the top portion of each semiconductor fin 20. The anneal process can be performed at a temperature ranging from 900° C. to 1150° C. The drain regions 60 can have a dopant concentration ranging from $1\times10^{18}$ atoms/cm$^3$ to $1\times10^{21}$ atoms/cm$^3$. In one embodiment, each of the source regions 40 and drain regions 60 comprises n-type dopants. A remaining portion of each non-doped semiconductor fin portion 20P that is located between the source region 40 and the drain region 60 constitutes a channel region 20C. After forming the drain regions 60, the second dopant-rich layer 58 may be removed from the structure. The removal of the second dopant-rich layer 58 is optional and can be omitted in some embodiments of the present application.

Vertical FinFETs are thus formed. Each vertical FinFET includes a source region 40 and a drain region 60 formed at a bottom portion and a top portion of a semiconductor fin 20, respectively, a channel region 20C located between the source region 40 and the drain region 60, and a metal gate (52A, 54A) formed along sidewalls of the semiconductor fin 20, spanning the vertical distance between the source region 40 and drain region 60. Current thus flows vertically through the channel region 20C when an appropriate bias is applied to the metal gate (52A, 54A). In the present application, since the source region 40 and the drain region 60 in each vertical FinFET are formed by a dopant diffusion process, the overlaps between the metal gate (52A, 54A) and the source region 40 and between the metal gate (52A, 54A) and the drain region 60 can be well-controlled. The vertical FinFETs thus formed are self-aligned.

Referring to FIGS. 15A-15C, a contact level dielectric layer 70 is formed over the second dopant-rich layer 58, if present, or the fin caps 22, the metal gates (52A, 54A), the upper-level local interconnect (52B, 54B) and the dielectric layer 50. The contact level dielectric layer 70 may include a dielectric material such as, for example, oxides, nitrides or oxynitrides. In one embodiment, the contact level dielectric layer 70 includes SiCN. The contact level dielectric layer 70 may be formed, for example, by CVD or spin-coating. The contact level dielectric layer 70 may be self-planarizing, or the top surface of the contact level dielectric layer 70 can be planarized, for example, by CMP. In one embodiment, the planarized top surface of the contact level dielectric layer 70 is located above the topmost surface of the second dopant-rich layer 58, if present, or the top surfaces of the fin caps 22.

Referring to FIGS. 16A-16C, various contact structures are formed. The contact structures include a gate contact structure 82 extending through the contact level dielectric layer 70 and the second dopant-rich layer 58, if present, to form contact with the upper-level local interconnect (52B, 54B) that connects adjacent metal gates (52A, 54A), a source contact structure 84 extending through the contact level dielectric layer 70, the second dopant-rich layer 58, if present and the dielectric layer 50 to form contact with one of the lower-level local interconnects 44 that connects individual source regions 40, and a drain contact structure 86 extending through the contact level dielectric layer 70, the second dopant-rich layer 58, if present, and the fin cap 22 to form contact with each of the drain regions 60. The gate, source and drain contact structures 82, 84, 86 can be formed by formation of contact openings (not shown) within the dielectric material components including the fin cap 22, the dielectric layer 50, the second dopant-rich layer 58, if present and the contact level dielectric layer 70 utilizing a combination of lithographic patterning and anisotropic etch followed by deposition of a conductive material (e.g., copper) and planarization that removes an excess portions of the conductive material from above the top surface of the contact level dielectric layer 70. Optionally, contact liners (not shown) may be formed on the sidewalls and bottoms surfaces of the contact openings before filling the contact openings with the conductive material. The contact liners may include TiN.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A method of forming a semiconductor structure comprising:
   forming a plurality of fin stacks on a substrate, wherein each of the plurality of fin stacks comprises a semiconductor fin and a fin cap, wherein a bottom portion of each semiconductor fin is laterally surrounded by an insulator layer;
   forming sacrificial spacers on sidewalls of the semiconductor fins that are not covered by the insulator layer;
   recessing the insulator layer to provide an insulator layer portion, wherein a gap is formed between each sacrificial spacer and the insulator layer portion, each gap exposing a portion of a sidewall of the bottom portion of each semiconductor fin;
   doping the bottom portion of each semiconductor fin to form a source region in an entirety of the bottom portion of each semiconductor fin; wherein each gap exposes sidewalls of each source region;
   forming lower-level local interconnects over the insulator layer portion to connect the source regions, each of the lower-level local interconnects filling the gap and contacting sidewalls of adjacent source regions;
   forming a dielectric layer to cover the lower-level local interconnects;
   removing the sacrificial spacers to expose sidewalls of a non-doped portion of each semiconductor fin;
   forming a metal gate along sidewalls of a lower portion of the non-doped portion of each semiconductor fin and forming upper-level local interconnects connecting the metal gates, each of the upper-level local interconnects contacting sidewalls of adjacent metal gates; and
   doping an upper portion of the non-doped portion of each semiconductor fin to form a drain region therein.

2. The method of claim 1, wherein the forming the source region comprises:
   forming a first dopant-rich layer over the insulator layer portion, wherein the first dopant-rich layer fills the gaps;
   diffusing dopants in the first dopant-rich layer into each semiconductor fin to form a first doped region at the bottom of each semiconductor fin, wherein the first doped region constitutes the source region; and
   removing the first dopant-rich layer.

3. The method of claim 2, wherein the diffusing the dopants is performed by an anneal.

4. The method of claim 2, wherein the first-dopant rich layer comprises phosphorus-doped silicate glass or boron-doped silicate glass.

5. The method of claim 2, wherein the forming the lower-level local interconnects comprises:
   forming a metal layer over the insulator layer portion, the metal layer filling the gaps re-exposed by the removal of the first dopant-rich layer; and
   patterning the metal layer.

6. The method of claim 5, wherein the metal layer has a top surface coplanar with a top surface of each source region.

7. The method of claim 5, wherein the metal layer has a topmost surface below a top surface of each source region.

8. The method of claim 5, wherein the metal layer comprises Cu, W, Al or an alloy thereof.

9. The method of claim 1, wherein the forming the metal gate and the forming the upper-level local interconnects comprise:
   forming a gate dielectric layer over the exposed sidewalls of the non-doped portion of each semiconductor fin, each fin cap, the dielectric layer and the lower-level local interconnects;
   forming a gate electrode layer over the gate dielectric layer; and
   patterning the gate electrode layer and the gate dielectric layer.

10. The method of claim 1, wherein the forming the drain region comprises:
   forming a second dopant-rich layer over the dielectric layer, the metal gates, the upper-level local interconnects and a portion of the non-doped portion of each semiconductor fin that is not covered by each metal gate; and
   diffusing dopants in the second dopant-rich layer into the non-doped portion of each semiconductor fin to form a second doped region at the top of each semiconductor fin, wherein the second doped region constitutes the drain region.

11. The method of claim 10, wherein the second dopant-rich layer comprises phosphorus-doped silicate glass or boron-doped silicate glass.

12. The method of claim 1, further comprising forming a gate contact structure contacting one of the upper-level local interconnects, a source contact structure contacting one of the lower-level local interconnects, and a drain contact structure contacting the drain region in each semiconductor fin.

13. The method of claim 12, wherein the forming the gate contact structure, the source contact structure and the drain contact structure comprises:
    forming a contact level dielectric layer over the second dopant-rich layer;
    forming contact openings through at least the contact level dielectric layer and the second dopant-rich layer to expose top surfaces of one of the upper-level local interconnects, one of the lower-level local interconnects, and the drain region in each semiconductor fin; and
    filling the contact openings with a conductive metal.

14. The method of claim 1, wherein the dielectric layer comprises a dielectric material that has a different etch selectivity than the sacrificial spacers.

15. The method of claim 1, wherein the source region has outermost sidewalls that are vertically aligned to outermost sidewalls of the drain region.

16. The method of claim 15, wherein a remaining portion of the semiconductor fin between the source region and the drain region constitutes a channel region, wherein the channel region has outermost sidewalls that are vertically aligned to the outermost sidewalls of the source region and the drain region.

17. A method of forming a semiconductor structure comprising:
    forming a plurality of fin stacks on a substrate, wherein each of the plurality of fin stacks comprises a semiconductor fin and a fin cap, wherein a bottom portion of each semiconductor fin is laterally surrounded by an insulator layer;
    forming sacrificial spacers on sidewalls of the semiconductor fins that are not covered by the insulator layer;
    recessing the insulator layer to provide an insulator layer portion, wherein a gap is formed between each sacrificial spacer and the insulator layer portion, each gap exposing a portion of a sidewall of the bottom portion of each semiconductor fin;
    doping the bottom portion of each semiconductor fin utilizing a first dopant diffusion process to form a source region in an entirety of the bottom portion of each semiconductor fin;
    wherein each gap exposes sidewalls of each source region;
    forming lower-level local interconnects over the insulator layer portion to connect the source regions, each of the lower-level local interconnects filling the gap and contacting sidewalls of adjacent source regions;
    forming a dielectric layer to cover the lower-level local interconnects;
    removing the sacrificial spacers to expose sidewalls of a non-doped portion of each semiconductor fin;
    forming a metal gate along sidewalls of a lower portion of the non-doped portion of each semiconductor fin and forming upper-level local interconnects connecting the metal gates, each of the upper-level local interconnects contacting sidewalls of adjacent metal gates; and
    doping an upper portion of the non-doped portion of each semiconductor fin utilizing a second dopant diffusion process to form a drain region therein.

18. The method of claim 17, wherein the first dopant diffusion process comprises:
    forming a first dopant-rich layer over the insulator layer portion, wherein the first dopant-rich layer fills the gaps;
    diffusing dopants in the first dopant-rich layer into each semiconductor fin by an anneal to form a first doped region at the bottom of each semiconductor fin, wherein the first doped region constitutes the source region; and
    removing the first dopant-rich layer.

19. The method of claim 17, wherein the second diffusion dopant process comprises:
    forming a second dopant-rich layer over the dielectric layer, the metal gates, the upper-level local interconnects and a portion of the non-doped portion of each semiconductor fin that is not covered by each metal gate; and
    diffusing dopants in the second dopant-rich layer into the non-doped portion of each semiconductor fin by annealing to form a second doped region at the top of each semiconductor fin, wherein the second doped region constitutes the drain region.

20. The method of claim 17, further comprising forming a gate contact structure contacting one of the upper-level local interconnects, a source contact structure contacting one of the lower-level local interconnects, and a drain contact structure contacting the drain region in each semiconductor fin, wherein the forming the gate contact structure, the source contact structure and the drain contact structure comprises:
    forming a contact level dielectric layer over the second dopant-rich layer;
    forming contact openings through at least the contact level dielectric layer and the second dopant-rich layer to expose top surfaces of one of the upper-level local interconnects, one of the lower-level local interconnects, and the drain region in each semiconductor fin; and
    filling the contact openings with a conductive metal.

* * * * *